United States Patent
Ooe et al.

(10) Patent No.: US 7,842,342 B2
(45) Date of Patent: Nov. 30, 2010

(54) METHOD FOR MANUFACTURING PROTECTIVE LAYER

(75) Inventors: Yoshinao Ooe, Kyoto (JP); Kazuo Uetani, Osaka (JP); Akira Shiokawa, Osaka (JP); Kaname Mizokami, Osaka (JP); Hiroyuki Kado, Osaka (JP)

(73) Assignee: Panasonic Corporation, Osaka (JP)

( * ) Notice: Subject to any disclaimer, the term of this patent is extended or adjusted under 35 U.S.C. 154(b) by 776 days.

(21) Appl. No.: 11/666,602

(22) PCT Filed: Sep. 11, 2006

(86) PCT No.: PCT/JP2006/317966
§ 371 (c)(1),
(2), (4) Date: Apr. 30, 2007

(87) PCT Pub. No.: WO2007/032303
PCT Pub. Date: Mar. 22, 2007

(65) Prior Publication Data
US 2007/0298162 A1 Dec. 27, 2007

(30) Foreign Application Priority Data
Sep. 14, 2005 (JP) ............................. 2005-266557

(51) Int. Cl.
*C23C 16/00* (2006.01)
(52) U.S. Cl. .............................. 427/255.29; 427/255.31
(58) Field of Classification Search .................. 427/255, 427/29, 255.31
See application file for complete search history.

(56) References Cited

U.S. PATENT DOCUMENTS

| | | | |
|---|---|---|---|
| 5,259,735 A | 11/1993 | Takahashi et al. | |
| 6,769,946 B1 * | 8/2004 | Sasaki et al. | 445/25 |
| 2002/0121861 A1 * | 9/2002 | Katou et al. | 313/587 |
| 2005/0206318 A1 * | 9/2005 | Hirota et al. | 313/585 |
| 2005/0212429 A1 * | 9/2005 | Aoki et al. | 313/587 |
| 2006/0049734 A1 * | 3/2006 | Sato et al. | 313/153 |
| 2008/0291128 A1 * | 11/2008 | Kim | 345/60 |

(Continued)

FOREIGN PATENT DOCUMENTS

JP     4-326943 A     11/1992

(Continued)

OTHER PUBLICATIONS

Oumi, Kenichi, et al., "MgO thin films for plasma display panel formed by plasma process". Surface and Coatings Technology 169-170 (2003) pp. 562-565.*

(Continued)

*Primary Examiner*—Bret Chen
(74) *Attorney, Agent, or Firm*—McDermott Will & Emery LLP

(57) ABSTRACT

A method for manufacturing a protective layer such that when the protective layer is formed in a film-forming chamber, the partial pressure of water in the film-forming chamber is controlled by the exhaust velocity of the water in the film-forming chamber. During formation of the protective layer the total pressure in the film-forming chamber is kept constant. In addition, the partial pressure of the water in the film-forming chamber is controlled while introducing a gas into the film-forming chamber, thereby controlling the ratio of the partial pressure of hydrogen to the partial pressure of oxygen in the film-forming chamber.

2 Claims, 5 Drawing Sheets

U.S. PATENT DOCUMENTS

2009/0017189 A1* 1/2009 Uetani et al. .................. 427/8

FOREIGN PATENT DOCUMENTS

| JP | 6-306601 A | 11/1994 |
| JP | 2000-129428 | 5/2000 |
| JP | 2000-129428 A | 5/2000 |
| JP | 2000-329324 | * 11/2000 |
| JP | 2001-26868 A | 1/2001 |
| JP | 2003-313661 | 11/2003 |
| JP | 2003-313661 A | 11/2003 |
| JP | 2005-50804 A | 2/2005 |
| JP | 2008-266682 | * 11/2008 |
| WO | WO 2007/139051 | * 1/2006 |

OTHER PUBLICATIONS

Koiwa, Ichiro, et al., "MgO Powders for Protective Layer of Alternating Current Plasma Display Panel". Electronics and Communications in Japan, Part 2, vol. 79, No. 4, 1996, pp. 55-66.*

Chinese Office Action issued in Chinese Patent Application No. CN 2006800015015, mailed Jan. 16, 2009.

* cited by examiner

METHOD FOR MANUFACTURING PROTECTIVE LAYER

RELATED APPLICATIONS

This application is the U.S. National Phase under 35 U.S.C. §371 of International Application No. PCT/JP2006/317966, filed on Sep. 11, 2006, which in turn claims the benefit of Japanese Application No. 2005-266557, filed on Sep. 14, 2005, the disclosures of which Applications are incorporated by reference herein.

TECHNICAL FIELD

The present invention relates to a method and apparatus for manufacturing a protective layer which is disposed on a substrate. The invention more particularly relates to a method and apparatus for manufacturing a good-quality protective layer which can be suitably used to coat a dielectric layer in a plasma display panel.

BACKGROUND ART

A plasma display panel (hereinafter, PDP) includes a front panel and a back panel oppositely disposed to each other and sealed at their periphery with a sealing member. The front panel and the back panel have a discharge space therebetween filled with a discharge gas including neon (Ne) and xenon (Xe).

The front panel includes a glass substrate; display electrode pairs; a dielectric layer; and a protective layer. The display electrode pairs each consist of a scan electrode and a sustain electrode formed in a stripe pattern on the glass substrate. The dielectric layer coats the display electrode pairs, and the protective layer coats the dielectric layer. Each of the display electrode pair consists of a transparent electrode and a metal bus electrode formed thereon.

On the other hand, the back panel includes a glass substrate; address electrodes; an base dielectric layer; barrier ribs; and phosphor layers of red, green, and blue. The address electrodes are formed in a stripe pattern on the glass substrate. The base dielectric layer coats the address electrodes. The barrier ribs are formed in a strip pattern on the base dielectric layer so as to partition the discharge space in correspondence with the address electrodes. The phosphor layers are formed on the base dielectric layer between the barrier ribs and also on side surfaces of the barrier ribs.

The front panel and the back panel are oppositely disposed to each other so that the display electrode pairs and the address electrodes can be at right angles to each other and have discharge cells at their intersections. The discharge cells are arranged in a matrix where three adjacent discharge cells having red, green, and blue phosphor layers arranged in the direction of the display electrode pairs form a pixel for color display. In a PDP, a predetermined voltage is applied between the scan electrodes and the address electrodes and between the scan electrodes and the sustain electrodes so as to generate a gas discharge. The gas discharge generates ultraviolet light which excites the phosphor layers, allowing them to emit light so as to display color images.

In a PDP thus structured, the protective layer is required to have a high resistance to sputtering and a large secondary electron emission coefficient. For this reason, a protective layer of magnesium oxide (MgO) is widely used. The sputtering resistance and secondary emission characteristics can protect the dielectric layer from sputtering and reduce the discharge voltage.

The protective layer, which can be formed by electron beam deposition or using a plasma gun, can have very different film properties depending on the method and conditions of its formation. Japanese Patent Unexamined Publication No. 2005-50804 shows an example of stably manufacturing a protective layer having excellent film properties in the following manner. When the protective layer is formed by electron beam deposition of magnesium oxide (MgO), the partial pressures of various gases including oxygen present in the evaporation chamber are controlled in a certain range.

The protective layer of magnesium oxide (MgO) can significantly change film properties due to oxygen deficiency or impurity incorporation during its formation. In a widely used film-forming apparatus of substrate transfer type, a glass substrate finished up to the dielectric layer is placed on a tray and applied with the protective layer in a film-forming chamber. When the glass substrate passes through the film-forming chamber, the magnesium oxide (MgO) film pieces can adhere to the tray and the mask. When the glass substrate is taken out into the atmosphere from the film-forming chamber, the magnesium oxide (MgO) adhering to the tray and the mask absorbs moisture in the atmosphere. When another magnesium oxide (MgO) film is formed on the next glass substrate that is being transferred into the film-forming chamber using the same tray and mask, the moisture absorbed in the tray and the mask is released into the film-forming chamber. Part of the moisture is dissociated into hydrogen and oxygen in the film-forming chamber. These gases cause a change in the partial pressures in the film-forming chamber, thereby causing variations in the film properties of the magnesium oxide (MgO) film.

As a way to stabilize the partial pressures so as to reduce the amount of water brought into the film-forming chamber, in a film-forming apparatus of substrate transfer type, different trays and different masks are used inside and outside the film-forming chamber. However, as the substrate size becomes larger and more diverse, the transfer mechanism becomes more complicated. As a result, the apparatus has a lower reliability and a higher cost.

As another way to stabilize the partial pressures so as to reduce the amount of water brought into the film-forming chamber, the atmosphere during the transfer of the substrate is made low in dew point and water content. This method requires a plurality of pumps such as cryopumps or turbomolecular pumps having a high exhausting capacity. In addition, it is necessary to vary the exhaust velocity by changing the opening of a conductance valve disposed between the film-forming chamber and the pumps or the number of the pumps. The problem is that this approach causes variation in the exhaust velocity not only of the water but also of the other gases, making it difficult to keep the partial pressures in the film-forming chamber constant. On the other hand, in the case where the exhaust velocity is varied by changing the speed of the turbomolecular pumps, a change in the compression ratio causes a change in the component ratio of the exhaust gas, making it impossible to control the partial pressure of water independently.

SUMMARY OF THE INVENTION

In a method for manufacturing a protective layer according to the present invention, when the protective layer is formed in a film-forming chamber, the partial pressure of water in the film-forming chamber is controlled by the exhaust velocity of the water in the film-forming chamber, with the total pressure in the film-forming chamber kept constant.

This method allows the protective layer, which is susceptible to the partial pressure of water to be always formed under the same conditions. As a result, the protective layer having excellent properties can be formed in a stable manner without being influenced by outside humidity, the moisture adhering to a substrate jig, or the like.

Figure 1:
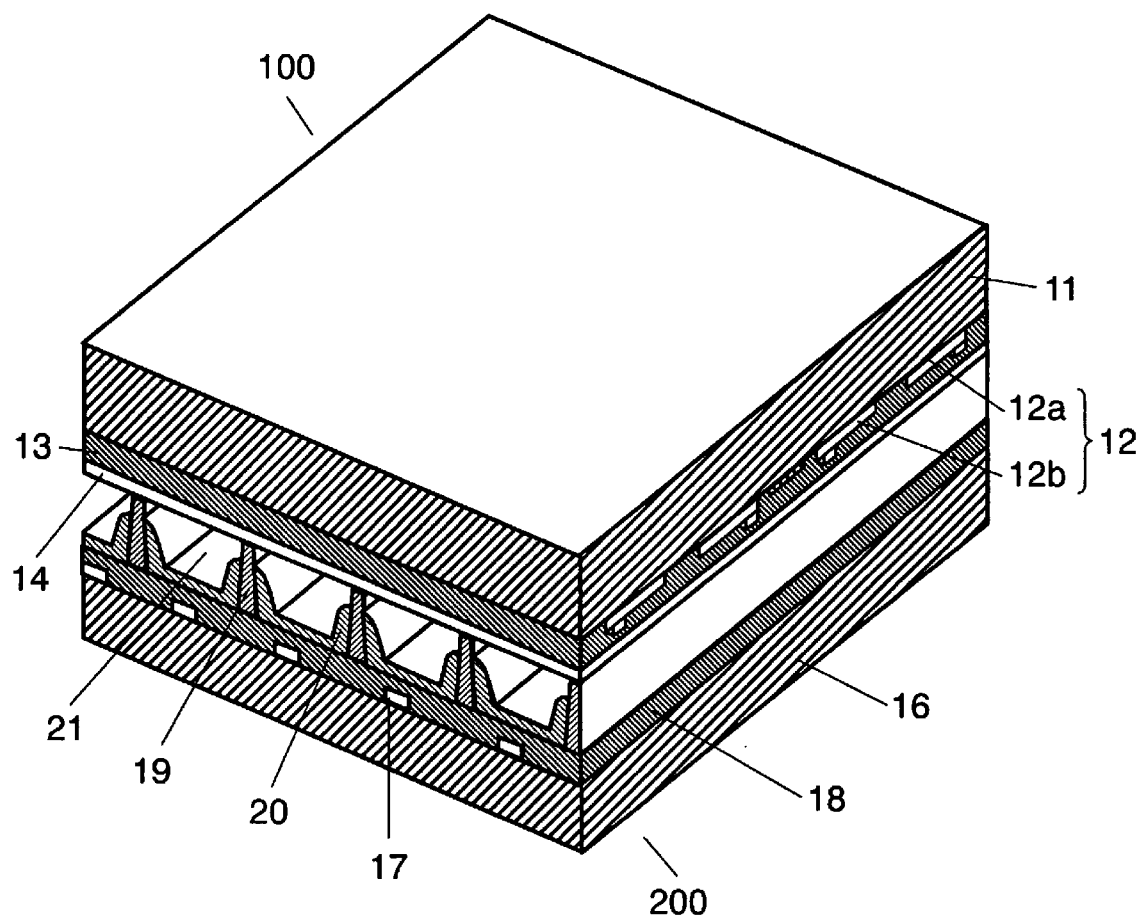
FIG. 1 is a perspective view showing a configuration of an AC surface-discharge type PDP.

REFERENCE MARKS IN THE DRAWINGS 11 front glass substrate
12 display electrode pair
12a scan electrode
12b sustain electrode
13 dielectric layer
14 protective layer
16 back glass substrate
17 address electrode
18 base dielectric layer
19 barrier rib
20 phosphor layer
21 discharge space
30 substrate receiving chamber
31 substrate preheating chamber
32 film-forming chamber
33 substrate cooling chamber
34 substrate removing chamber
40 evaporation material
41 evaporation hearth
42 electron gun
43 exhaust pump (first exhaust part)
44 electron beam
45 impingement point
46 shutter
47 gas inlet
48 tray
49 gas analyzer
51 cryotrap
52 turbomolecular pump
53 freezer
54 thermocouple
100 front panel
200 back panel

DETAILED DESCRIPTION OF PREFERRED EMBODIMENT

A method and apparatus for manufacturing a protective layer according to an embodiment of the present invention is described as follows with reference to drawings.

Exemplary Embodiment

The protective layer manufactured using the method and apparatus for manufacturing a protective layer according to the present invention is useful to protect the dielectric layer of a PDP. Therefore, first, a PDP in which the protective layer is used is described as follows.

FIG. 1 is a perspective view showing a configuration of an AC surface-discharge type PDP. In the PDP, front panel 100 includes front glass substrate 11; display electrode pairs 12; dielectric layer 13; and protective layer 14. Display electrode pairs 12 consist of N scan electrodes 12a and N sustain electrodes 12b which are formed on a main surface of front glass substrate 11. Dielectric layer 13 coats display electrode pairs 12. Protective layer 14 made of a magnesium oxide (MgO) thin film coats dielectric layer 13. Scan electrodes 12a and sustain electrodes 12b each consists of a transparent electrode and a metal bus electrode laminated thereon.

Back panel 200 includes back glass substrate 16; M address electrodes 17; base dielectric layer 18; barrier ribs 19; and phosphor layers 20. M address electrodes 17 are formed on a main surface of back glass substrate 16. Base dielectric layer 18 coats address electrodes 17. Barrier ribs 19 are formed between address electrodes 17 on base dielectric layer 18. Phosphor layers 20 are applied between barrier ribs 19.

Front panel 100 and back panel 200 are oppositely disposed to each other so as to make display electrode pairs 12 and address electrodes 17 at right angles to each other with barrier ribs 19 therebetween. The image display region is sealed at its periphery with a sealing member. Front panel 100 and back panel 200 have discharge space 21 therebetween filled with a discharge gas such as a mixture of neon (Ne) and xenon (Xe) at a pressure of 45 to 80 kPa. The intersections of display electrode pairs 12 and address electrodes 17 function as discharge cells.

Figure 2A:
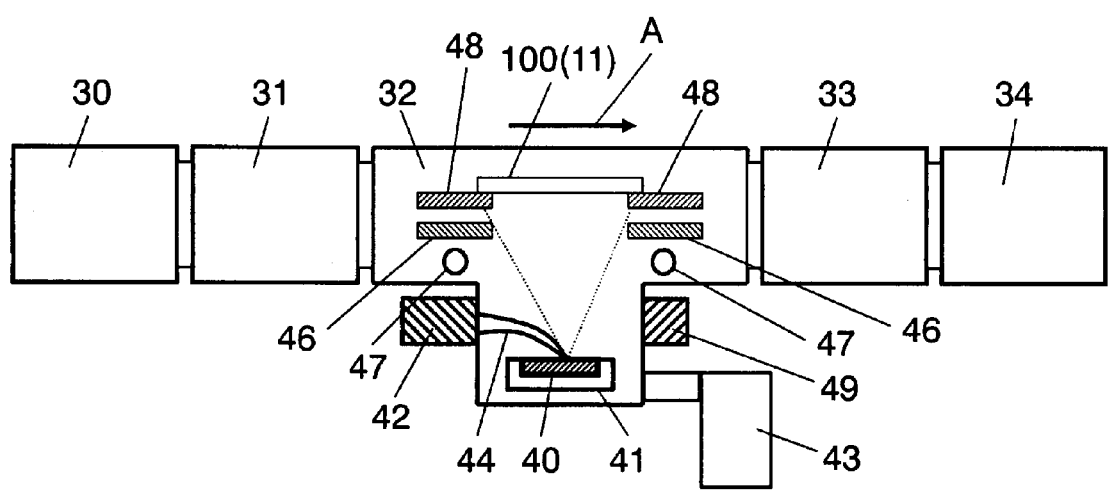
FIG. 2A is a sectional side view showing a configuration of an apparatus for manufacturing a protective layer according to an embodiment of the present invention.

The following is a description of the manufacture of protective layer 14 of front panel 100 using the method and apparatus for manufacturing a protective layer according to the embodiment of the present invention. FIG. 2A is a sectional side view showing a configuration of the apparatus for manufacturing a protective layer according to the embodiment, and FIG. 2B is a plan view of a film-forming chamber of the apparatus.

Figure 2B:
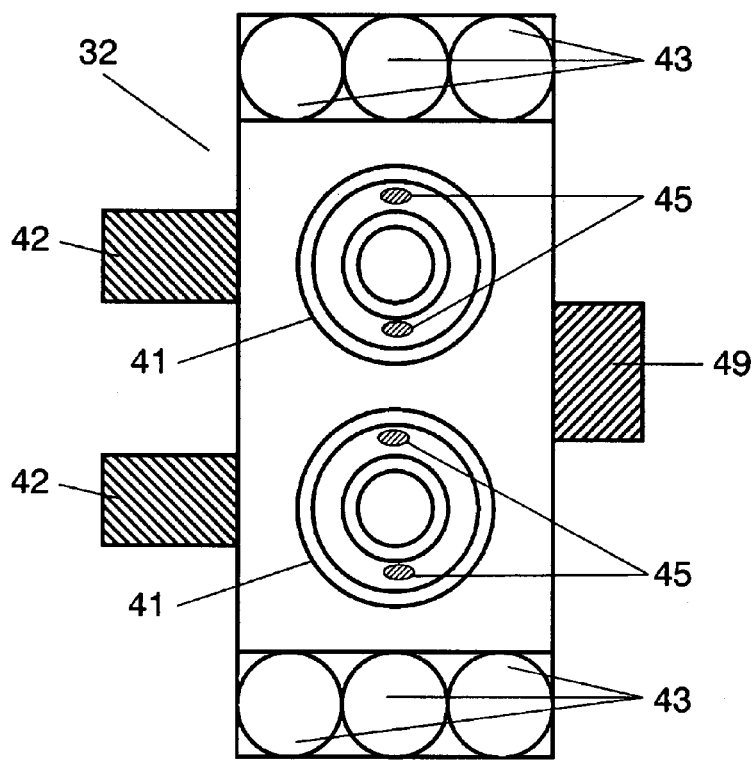
FIG. 2B is a plan view showing a structure of a film-forming chamber of the apparatus for manufacturing a protective layer according to the embodiment of the present invention.

The apparatus for manufacturing a protective layer shown in FIGS. 2A and 2B is an electron-beam evaporation apparatus of substrate transfer type for forming a magnesium oxide (MgO) film. As shown in FIG. 2A, the evaporation apparatus includes substrate receiving chamber 30, substrate preheating chamber 31, film-forming chamber 32, substrate cooling chamber 33, and substrate removing chamber 34. First, front panel 100 of the PDP that is finished up to dielectric layer 13 is placed on tray 48 and transferred into substrate receiving chamber 30. Front panel 100 is then transferred into substrate preheating chamber 31 to be preheated, and transferred into film-forming chamber 32 in which a magnesium oxide (MgO) film as the protective layer is formed on dielectric layer 13 of front panel 100.

Film-forming chamber 32 includes evaporation hearths 41 each with evaporation material 40 inside and electron guns 42, and is connected to a plurality of exhaust pumps 43 which are a first exhaust part to evacuate the chamber to high vacuum. Also, substrate preheating chamber 31 and substrate cooling chamber 33 each include exhaust pumps (unillustrated) to depressurize these chambers. Film-forming chamber 32 further includes gas analyzer 49 such as a quadrupole mass analyzer (QMS), which is a partial pressure measuring part to measure the partial pressures of various gases during the film formation. Film-forming chamber 32 further includes gas inlets 47, which are a gas inlet part to introduce at least oxygen thereinto.

In film-forming chamber 32, exhaust pumps 43 as the first exhaust part bring film-forming chamber 32 to high vacuum, and the electron beams emitted from electron guns 42 heat evaporation materials 40. The resulting vapor is deposited on front glass substrate 11 so as to form a magnesium oxide (MgO) film. Film-forming chamber 32 is provided with shutters 46 below front glass substrate 11 so as to control the scope of the vapor to front glass substrate 11.

As shown in FIG. 2B, electron guns 42 and exhaust pumps 43 are disposed on side surfaces of film-forming chamber 32. Alternatively, in view of the structure of the apparatus, exhaust pumps 43 may be disposed on the side surface opposite to the side surface having electron guns 42 thereon. In the case of an apparatus for manufacturing a large-size PDP, as shown in FIG. 2B, film-forming chamber 32 includes a plurality of exhaust pumps 43 as the first exhaust part to evacuate film-forming chamber 32 to high vacuum in addition to a plurality of evaporation hearths 41 and electron guns 42.

Figure 3:
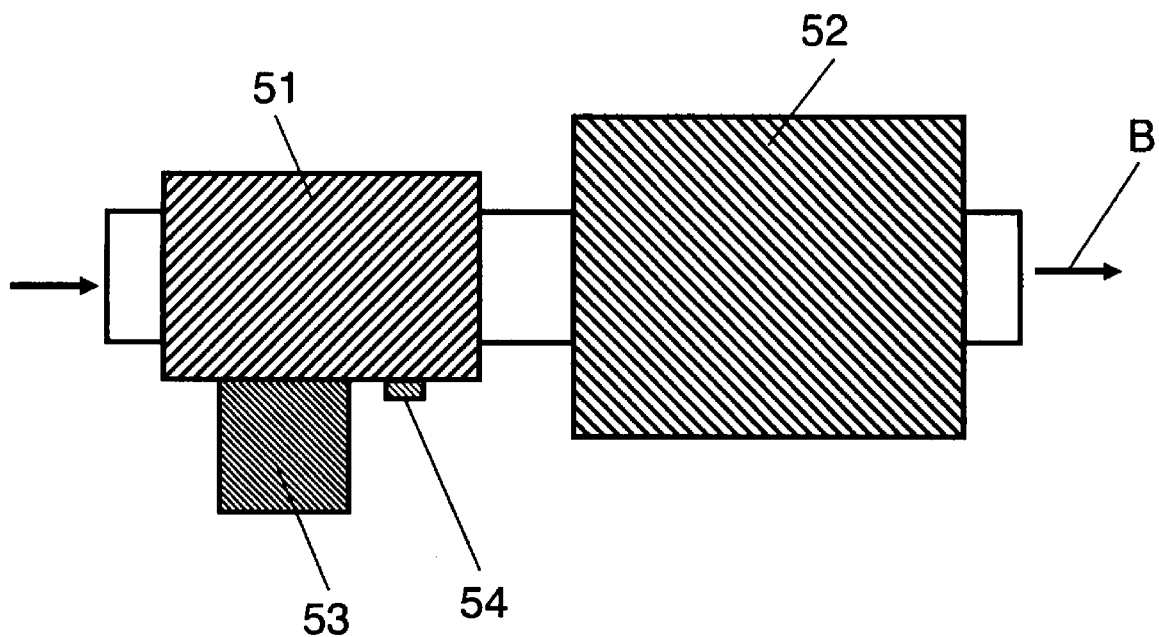
FIG. 3 is a diagram showing a structure of an exhaust pump to discharge water used in the apparatus for manufacturing a protective layer according to the embodiment of the present invention.

FIG. 3 is a diagram showing a structure of an exhaust pump as a second exhaust part to control the exhaust velocity of water used in the apparatus according to the embodiment of the present invention. The second exhaust part consists of cryotrap 51 and turbomolecular pump 52. The upstream side of cryotrap 51 is connected to film-forming chamber 32 so as to evacuate film-forming chamber 32 in the direction of arrow "B". Cryotrap 51 is cooled by freezer 53 and temperature-controlled by temperature controller 54. Cryotrap 51 selectively exhausts water, and the cooling temperature of the cryopanel controls the exhaust velocity of the water. The cryopanel of cryotrap 51 is cooled with liquid helium and normally used at not more than 20 K. Cryotrap 51 is characterized by a high exhaust velocity for hydrogen and water and by a constant exhaust velocity for other gases in the temperature range where cryotrap 51 can be used.

Next, the process of forming a magnesium oxide (MgO) film as protective layer 14 of the PDP is described as follows. First, front panel 100 that is finished up to dielectric layer 13 is placed on tray 48 and transferred into substrate receiving chamber 30. Front panel 100 is then transferred into substrate preheating chamber 31 and heated there by a heater while being evacuated to vacuum. Then, front panel 100 is transferred into film-forming chamber 32 in the direction of arrow "A". In film-forming chamber 32, while front panel 100 is being transferred at a constant speed, protective layer 14 is formed on dielectric layer 13. When the formation of protective layer 14 is over, front panel 100 is transferred with tray 48 into substrate cooling chamber 33, cooled to a predetermined temperature under vacuum, and then transferred into substrate removing chamber 34 so as to be removed there, thereby completing the series of operations.

In film-forming chamber 32, electron beams 44 emitted from electron guns 42 are deflected and focused onto a plurality of impingment points 45 so as to be irradiated to evaporation materials 40 of MgO particle aggregates on evaporation hearths 41. As a result, evaporation materials 40 are heated and evaporated so as to deposit a magnesium oxide (MgO) film as protective layer 14 on dielectric layer 13 of front panel 100 traveling above it. Evaporation hearths 41 slowly rotate so that evaporation materials 40 can be evenly heated by electron beams 44, thereby preventing the local evaporation of the material.

The magnesium oxide (MgO) film as protective layer 14 thus formed changes physical properties due to oxygen deficiency or impurity incorporation during its formation. The physical properties have been found to be susceptible to water in film-forming chamber 32 and to hydrogen dissociated from the water. For example, when the magnesium oxide (MgO) film has an oxygen deficiency or impurities such as H, OH, or C incorporated therein, it disrupts the bonds between Mg atoms and O atoms on the magnesium oxide (MgO) film surface. This results in a dangling bond not involved in the bonds, thereby degrading the secondary emission characteristics. The degradation of the secondary emission characteristics increases a starting voltage and variations in the electron emission characteristics in the plane of the PDP panel, thereby causing variations in display or display defects in the plane of the PDP panel. Such a display quality of PDPs that is susceptible to changes in film properties is a serious issue as well as an increase in screen size and an improvement in definition of PDPs.

The water that greatly affects the properties of the MgO film seems to be the water absorbed in the magnesium oxide (MgO) film pieces adhering to tray 48 transferred into film-forming chamber 32 together with front panel 100. In order to reduce the water, different trays 48 are used between atmosphere and vacuum as described earlier, or tray 48 is made to pass through an atmosphere in a dry environment with a low dew point. However, these measures are not enough to completely prevent the water from being brought into film-forming chamber 32.

In the embodiment of the present invention, film-forming chamber 32 uses turbomolecular pumps as main exhaust pumps 43. As shown in FIG. 3, each turbomolecular pump 52 is used in combination with cryotrap 51 connected thereto so as to control the exhaust velocity of water only. The cooling temperature of cryotrap 51 is controlled by placing the cooling capacity of freezer 53 for cooling cryotrap 51 and the temperature of the cryopanel under control of a signal from temperature controller 54. Controlling the cooling temperature of cryotrap 51 in this manner allows the exhaust velocity of the water to be controlled independently, thereby keeping the partial pressure of the water in a certain range.

Figure 4:
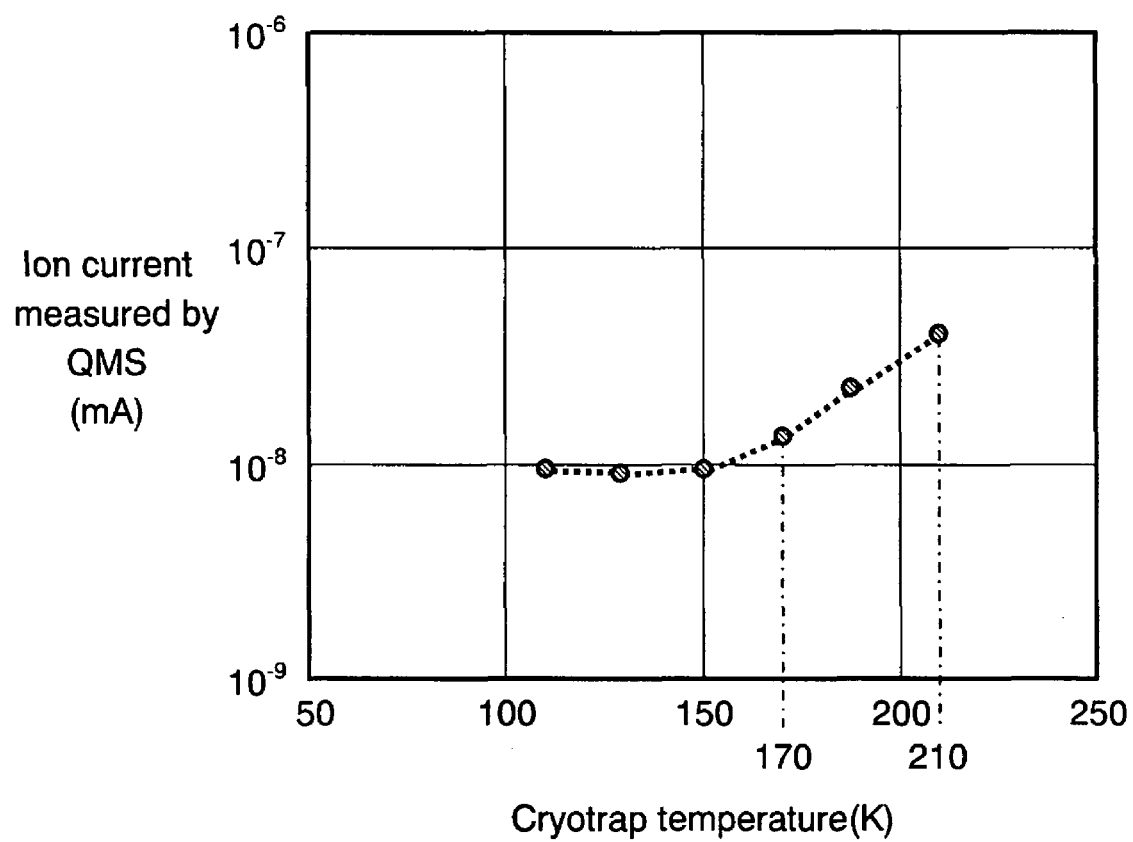
FIG. 4 is a graph showing the relation between the cooling temperature of a cryotrap and the ionic strength of water in the apparatus for manufacturing a protective layer according to the embodiment of the present invention.

FIG. 4 shows the results of the control of the exhaust velocity of water by actually controlling the cooling temperature of cryotrap 51. In FIG. 4, the vertical axis represents the ion current of water which is measured by the quadrupole mass analyzer (QMS) and corresponds to the partial pressure of the water. The results shown in FIG. 4 indicate that the exhaust velocity of the water can be controlled by the cooling temperature of cryotrap 51. The partial pressure of the water in film-forming chamber 32 is controllable when the cooling temperature of cryotrap 51 is in the range of 170 K to 210 K.

Figure 5:
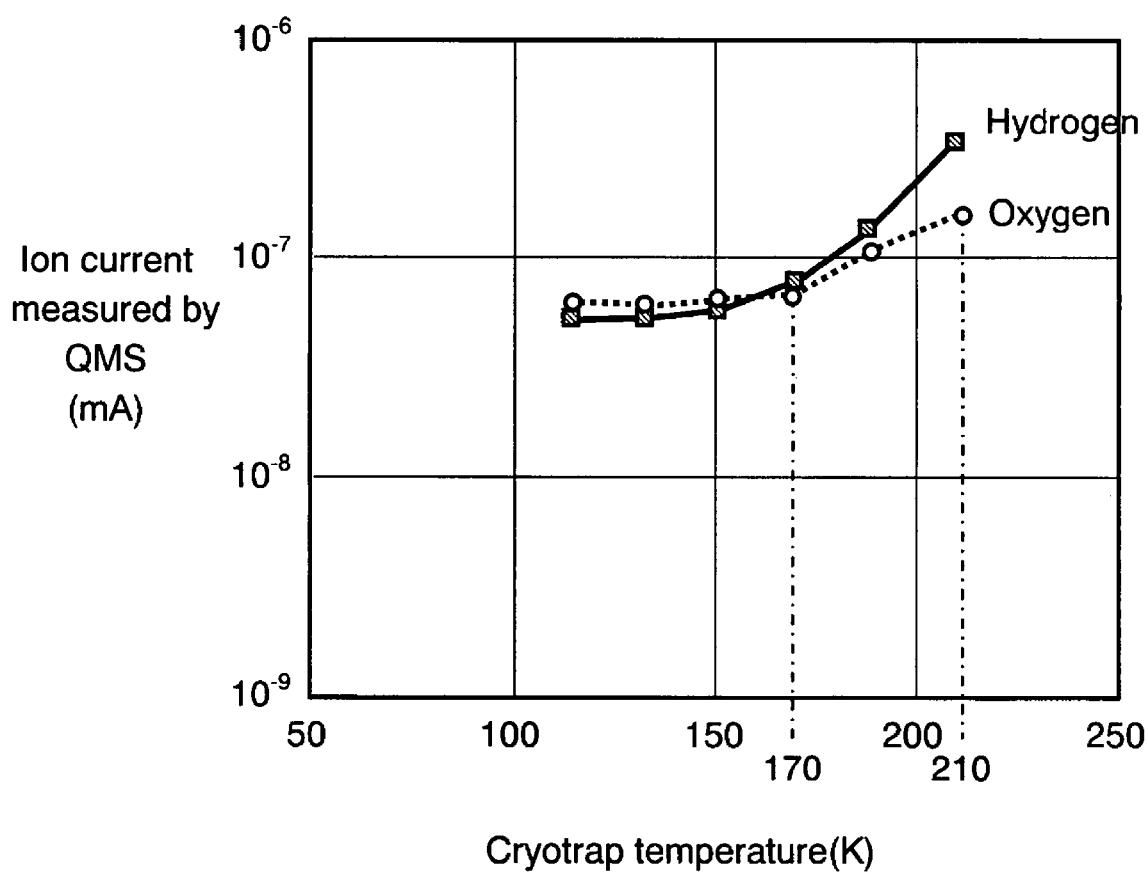
FIG. 5 is a graph showing the relation between the cooling temperature of the cryotrap and the ionic strengths of hydrogen and oxygen in the apparatus for manufacturing a protective layer according to the embodiment of the present invention.

On the other hand, FIG. 5 is a graph plotting the ion currents of hydrogen and oxygen with respect to the cooling temperature of cryotrap 51. The graph indicates that the ion currents change similarly to the ion current of the water in film-forming chamber 32 shown in FIG. 4. This means that the hydrogen and oxygen are those dissociated from the water in film-forming chamber 32. As a result, it turns out that the partial pressures of the oxygen and the hydrogen in film-forming chamber 32 can be controlled independently by the cooling temperature of cryotrap 51. Note that it has been confirmed that gases other than hydrogen and water do not depend on the temperature of cryotrap 51 and therefore their exhaust velocity does not change.

Consequently, this method allows the partial pressure of water during the film formation to be in a certain range. The gases in film-forming chamber 32 are analyzed by gas analyzer 49. The ratio of the partial pressure of hydrogen to the partial pressure of oxygen can be kept constant by changing the cooling temperature of cryotrap 51 with the total pressure kept constant. For example, the cooling temperature of cryotrap 51 can be set to a relatively high temperature at first and then lowered with an increase in the amount of water brought into film-forming chamber 32 by the magnesium oxide (MgO) film pieces adhering to tray 48 or the like. This allows the partial pressure of the water in film-forming chamber 32 to be kept in a certain range with the total pressure kept constant. A typical cryotrap 51 does not have a function of performing high-precision temperature control. For this reason, cryotrap 51 used in the present invention is provided on its surface with at least one thermocouple as temperature controller 54. Cryotrap 51 controls the performance of freezer 53 while monitoring the temperature measured by the thermocouple.

The following method is sometimes used to keep the ratio of the partial pressure of hydrogen to the partial pressure of oxygen in film-forming chamber 32 in a certain range. During the film formation, oxygen is introduced into film-forming chamber 32 from gas inlets 47 as a gas inlet part so as to control the internal atmosphere. This is done because of the following reason. When the partial pressure of water increases, even if the introduction amount of oxygen is changed while varying the exhaust velocity by changing the opening of the valve or by other methods, it is difficult to keep the ratio of the partial pressures of hydrogen to oxygen in a certain range. This is due to the difference in the exhaust velocity of various gases.

However, as described above, according to the embodiment of the present invention, the partial pressures of water, oxygen, and hydrogen can be kept in a certain range by the following method, with the total pressure in film-forming chamber 32 kept constant. The principle of the method is to control the following three parameters based on the partial pressure information detected by the quadrupole mass analyzer (QMS) of gas analyzer 49. The three parameters are the introduction amount of oxygen from gas inlets 47; the amount of exhaust from exhaust pumps 43; and the amount of exhaust of cryotrap 51 which discharges water independent of exhaust pumps 43.

The configuration of the apparatus for manufacturing a protective layer is not limited to the one described above. For example, it is possible to dispose more than one substrate preheating chamber 31 between substrate receiving chamber 30 and film-forming chamber 32 depending on the setting conditions for the temperature profiles. It is also possible to dispose more than one substrate cooling chamber 33 between film-forming chamber 32 and substrate removing chamber 34. The formation of the magnesium oxide (MgO) film in film-forming chamber 32 can be performed with the front panel 100 either still or moving.

The numbers of evaporation hearths 41, electron guns 42, and exhaust pumps 43 placed in film-forming chamber 32 are dependent on the transfer speed of the substrate and the size of front panel 100, and therefore can be different from the numbers shown in FIGS. 2A and 2B.

In the aforementioned description, protective layer 14 is formed by depositing a magnesium oxide (MgO) film.

Alternatively, besides magnesium oxide (MgO), other metal oxides such as a calcium oxide (CaO) or a strontium oxide (SrO) can be used to obtain the same advantages of the present invention.

INDUSTRIAL APPLICABILITY

The method and apparatus according to the present invention allows a protective layer or the like to be formed with the partial pressure of water kept constant and always under the same conditions. Therefore, the present invention is useful as a method and apparatus for manufacturing not only a protective layer for PDPs but also an electronic component or a display device.

The invention claimed is:

1. A method for manufacturing a protective layer, wherein when the protective layer is formed in a film-forming chamber, a partial pressure of water in the film-forming chamber is controlled by an exhaust velocity of the water in the film-forming chamber, with a total pressure in the film-forming chamber kept constant;
wherein the partial pressure of the water in the film-forming chamber is controlled while introducing at least oxygen into the film-forming chamber, thereby controlling a ratio of a partial pressure of hydrogen to a partial pressure of oxygen in the film-forming chamber.

2. The method for manufacturing a protective layer of claim 1, wherein
the protective layer is made of a magnesium oxide film.

* * * * *